US011201253B2

(12) United States Patent
Mitta et al.

(10) Patent No.: US 11,201,253 B2
(45) Date of Patent: Dec. 14, 2021

(54) HIGH PHOTOVOLTAIC-CONVERSION EFFICIENCY SOLAR CELL, METHOD FOR MANUFACTURING THE SAME, SOLAR CELL MODULE, AND PHOTOVOLTAIC POWER GENERATION SYSTEM

(71) Applicant: Shin-Etsu Chemical Co., Ltd., Tokyo (JP)

(72) Inventors: Ryo Mitta, Kamisu (JP); Takenori Watabe, Annaka (JP); Hiroyuki Ohtsuka, Nagano (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 101 days.

(21) Appl. No.: 15/749,123

(22) PCT Filed: Nov. 15, 2016

(86) PCT No.: PCT/JP2016/083811
§ 371 (c)(1),
(2) Date: Jan. 31, 2018

(87) PCT Pub. No.: WO2018/092189
PCT Pub. Date: May 24, 2018

(65) Prior Publication Data
US 2019/0013423 A1 Jan. 10, 2019

(51) Int. Cl.
*H01L 31/05* (2014.01)
*H01L 31/0224* (2006.01)
(Continued)

(52) U.S. Cl.
CPC ................ *H01L 31/022441* (2013.01); *H01L 31/02167* (2013.01); *H01L 31/05* (2013.01);
(Continued)

(58) Field of Classification Search
CPC . H01L 31/0224; H01L 31/0216; H01L 31/05; H01L 31/068; H01L 31/022441;
(Continued)

(56) References Cited

U.S. PATENT DOCUMENTS 5,032,884 A * 7/1991 Yamagishi ............ H01L 31/204 257/458
2003/0102022 A1 6/2003 Fath et al.
(Continued)

FOREIGN PATENT DOCUMENTS

EP 2879189 A2 6/2015
JP 2003-124483 A 4/2003
(Continued)

OTHER PUBLICATIONS

English translation of JP2003124483.*
(Continued)

*Primary Examiner* — Uyen M Tran
(74) *Attorney, Agent, or Firm* — Hauptman Ham, LLP

(57) ABSTRACT

To Provide a back contact type solar cell with high photovoltaic-conversion efficiency which can be easily manufactured with good yield at low cost. The high photovoltaic-conversion efficiency solar cell of the present invention includes on a back surface, as a non-light receiving surface, of a first conductive type semiconductor substrate: a first conductive type diffusion layer where first conductive type impurities are diffused; a second conductive type diffusion layer where second conductive type impurities are diffused; and a high resistive layer or an intrinsic semiconductor layer formed between the first conductive type diffusion layer and the second conductive type diffusion layer.

13 Claims, 7 Drawing Sheets

100
107
101
104
106
108
109
110

(51) Int. Cl.

| | |
|---|---|
| ***H01L 31/068*** | (2012.01) |
| ***H01L 31/18*** | (2006.01) |
| ***H01L 31/0216*** | (2014.01) |

(52) U.S. Cl.

CPC ........ *H01L 31/068* (2013.01); *H01L 31/0682* (2013.01); *H01L 31/18* (2013.01); *H01L 31/1804* (2013.01); *Y02E 10/547* (2013.01); *Y02P 70/50* (2015.11)

(58) Field of Classification Search

CPC ........... H01L 31/02167; H01L 31/0682; H01L 31/1804; Y02P 70/50; Y02E 10/547

See application file for complete search history.

(56) References Cited

U.S. PATENT DOCUMENTS

| | | | | |
|---|---|---|---|---|
| 2008/0173347 | A1* | 7/2008 | Korevaar .............. | H01L 31/036 136/255 |
| 2010/0108130 | A1* | 5/2010 | Ravi ..................... | H01L 31/061 136/255 |
| 2011/0000532 | A1* | 1/2011 | Niira ................... | H01L 31/1804 136/255 |
| 2014/0174526 | A1 | 6/2014 | Pawlak et al. | |
| 2014/0311567 | A1* | 10/2014 | Choi ................. | H01L 31/02167 136/258 |
| 2015/0007879 | A1 | 1/2015 | Kwon et al. | |
| 2016/0056322 | A1 | 2/2016 | Yang et al. | |
| 2016/0276515 | A1 | 9/2016 | Chang et al. | |

FOREIGN PATENT DOCUMENTS

| | | | |
|---|---|---|---|
| JP | 2003-533029 A | | 11/2003 |
| JP | 2007-59644 A | | 3/2007 |
| JP | 2007059644 | * | 3/2007 |
| JP | 2011-228529 A | | 11/2011 |
| JP | 2013-521645 A | | 6/2013 |
| JP | 2014-527296 A | | 10/2014 |
| JP | 2015-15472 A | | 1/2015 |
| JP | 2016-46525 A | | 4/2016 |
| JP | 2016-174154 A | | 9/2016 |
| KR | 10-2015-0084305 A | | 7/2015 |
| WO | 2011/109058 A2 | | 9/2011 |

OTHER PUBLICATIONS

Office Action in JP Application No. 2017-205408, dated Nov. 26, 2019, 28pp.

Office Action in JP Application No. 2017-205408, dated Dec. 4, 2018, 9pp.

Extended European Search Report in EP Application No. 16886820.6, dated Feb. 22, 2018, 7pp.

Written Opinion in PCT/JP2016/083811, dated Jan. 17, 2017, 6pp.

Office Action in JP Application No. 2017-522428, dated Jun. 6, 2017,12pp.

Ngwe Zin et al., "Laser-Assisted Shunt Removal on High-Efficiency Silicon Solar Cells", 27th European Photovoltaic Solar Energy Conference and Exhibition, Sep. 24, 2012, pp. 552-556, 5pp.

* cited by examiner

HIGH PHOTOVOLTAIC-CONVERSION EFFICIENCY SOLAR CELL, METHOD FOR MANUFACTURING THE SAME, SOLAR CELL MODULE, AND PHOTOVOLTAIC POWER GENERATION SYSTEM

RELATED APPLICATIONS

The present application is a National Phase of International Application Number PCT/JP2016/083811, filed Nov. 15, 2016.

TECHNICAL FIELD

The present invention relates to a back contact type solar cell with high photovoltaic conversion efficiency, a method for manufacturing the same, a solar cell module, and a photovoltaic power generation system.

BACKGROUND ART

A solar cell is typically made of multi-crystalline silicon, single-crystalline silicon, or the like, in a plate shape with a size of 100 to 150 mm square and a thickness of 0.1 to 0.3 mm, and a main material for the solar cell is a p-type semiconductor substrate doped with p-type impurities such as boron. In this solar cell, an n-type diffusion layer (emitter layer) and an antireflection film are formed on a light receiving surface that receives sunlight, and an electrode is formed penetrating the antireflection film so as to be in contact with the emitter layer.

In the solar cell, the electrode is essential for taking out a current obtained by photovoltaic conversion. However, since sunlight cannot enter the cell beneath the electrode regions on the light receiving surface due to shielding by the electrode, the larger the area of the electrode, the more the conversion efficiency degrades and the current decreases. Such a loss of the current due to the electrode formed on the light receiving surface is called a shadow loss.

In contrast, a back contact type solar cell has no shadow loss, with no electrode formed on the light receiving surface, and can thus absorb therein almost 100% of incident sunlight except for a small amount of reflected light that the antireflection film failed to prevent from reflection. It is thus possible in principle to achieve high conversion efficiency.

Typically, a back contact type solar cell 100 has a sectional structure as illustrated in FIG. 1. The back contact type solar cell 100 includes a semiconductor substrate 101, an emitter layer 104, a BSF (Back Surface Field) layer 106, antireflection films with passivation properties 107, 108, and electrodes 109, 110.

The semiconductor substrate 101 is a main material for the back contact type solar cell 100, and made of single-crystalline silicon, multi-crystalline silicon, or the like. While either a p-type or an n-type may be used, an n-type silicon substrate doped with n-type impurities such as phosphorus is often used. Hereinafter, a description will be given taking as an example the case of using the n-type silicon substrate. For the semiconductor substrate 101, a substrate in a plate shape with a size of 100 to 150 mm square and a thickness of 0.1 to 0.3 mm is preferred, and one main surface is used as a light receiving surface, and the other main surface is used as a non-light receiving surface (back surface).

A concave-convex structure for optical confinement is formed on the light receiving surface. The concave-convex structure is obtained by soaking the semiconductor substrate 101 in an acid or alkali solution for a certain period of time. Typically, this concave-convex structure is called a texture.

The back surface is formed with the emitter layer 104 being a p-type diffusion layer doped with p-type impurities such as boron, and the BSF layer 106 being an n-type diffusion layer doped with n-type impurities such as phosphorus.

The antireflection films with passivation properties 107, 108, made of SiN (silicon nitride) or the like are further formed on the light receiving surface formed with the texture and the back surface formed with the emitter layer 104 and the BSF layer 106, respectively.

Then, the electrode 109 is formed so as to be in contact with the emitter layer 104, and the electrode 110 is formed so as to be in contact with the BSF layer 106. These electrodes may be formed by sputtering or the like after opening contacts by using the etching paste or the like, or may be formed by using the screen printing method. When the screen printing method is to be used, conductive silver paste containing glass flit or the like is printed on the antireflection films with passivation properties 108 and dried so as to be in contact with the emitter layer 104 and the BSF layer 106 respectively after firing. By firing the conductive silver paste, the electrode 109 in contact with the emitter layer 104 and the electrode 110 in contact with the BSF layer 106 are respectively formed penetrating the antireflection films with passivation properties 107, 108. The electrodes 109, 110 are each made up of a bus bar electrode for externally taking out a photo-generation current generated in the back contact type solar cell 100, and a current-collecting finger electrode in contact with the bus bar electrode (illustration omitted).

In the back contact type solar cell with the structure illustrated in FIG. 1, if adjacent regions between the emitter layer as the p-type diffusion layer and the BSF layer as the n-type diffusion layer are long in total within the back surface, under an operating condition, namely when forward bias is applied, a leak current easily flows due to a tunnel effect or through impurity states, thus making it difficult to enhance the conversion efficiency.

Further, in case that the emitter layer and the BSF layer are adjacent, when the electrodes are formed on one layer, the formed position may be displaced to cause the electrode to be also in contact with the other layer, thereby reducing parallel resistance. This problem is particularly significant when the electrodes are formed on the BSF layer typically formed with a small width as compared with the width of the emitter layer.

These problems can be avoided by forming the emitter layer and the BSF layer with a certain gap formed therebetween throughout the back surface. At this time, the gap between the emitter layer and the BSF layer is preferably narrow in moderation. However, if the gap is to be controlled in the order of several μm to several tens of μm, the manufacturing cost would be high and the productivity would degrade, and hence such control is unrealistic. Meanwhile, when the gap is expanded in the order of several hundreds of μm, there is no other choice than to make the area of the emitter layer relatively small, leading to degradation in minority carrier collection efficiency, and a current thus decreases. That is, the conversion efficiency degrades.

Accordingly, there has been proposed a method of digging a trench between the emitter layer and the BSF layer by using a laser or the like to spatially separate the two layers (cf. Patent Document 1, Non Patent Document 1). However, such processing has a risk of damaging the semiconductor substrate body to cause degradation in conversion efficiency, and furthermore, the addition of the processing step increases the manufacturing cost. When the separation of the two layers is incomplete and some non-separated regions are left, a leak current is concentrated on the non-separated regions in the case that reverse bias is applied to the solar cell. For example, when one part of the module made of the solar cells is shaded, reverse bias is applied to the solar cell located in the shaded place, and a leak current is concentrated thereon. The place where the leak current is concentrated as thus described becomes locally hot and thus has a risk of igniting.

In order to eliminate such a risk, manufacturers of solar cells and modules incorporates bypass diodes into the module, and also they measure a leakage current of the cell under reverse bias. When the measured current of the module exceeds a standard value, they do not ship such module as a product. However, in the back contact type solar cell, it is difficult to meet the standard value since a boundary between the emitter layer as the p-type diffusion layer and the BSF layer as the n-type diffusion layer is very long as compared with that in a typical solar cell. This has caused a problem where a yield drops down when the standard value is strictly applied by laying weight on the performance and the safety, whereas the performance and the safety drop down when the yield is taken on the priority.

PRIOR ART REFERENCES

Patent Document

Patent Document 1: JP 2013-521645 T

Non Patent Document

Non Patent Document 1: Ngwe Zin et al., "LASER-ASSISTED SHUNT REMOVAL ON HIGH-EFFICIENCY SILICON SOLAR CELLS, "27th European Photovoltaic Solar Energy Conference and Exhibition

SUMMARY OF THE INVENTION

Problems to be Solved by the Invention

The present invention was made in order to solve the above problem, and it is an object of the present invention to provide a back contact type solar cell with high photovoltaic-conversion efficiency, a method for manufacturing the same, a solar cell module, and a photovoltaic power generation system.

Means for Solving the Problems (1) A high photovoltaic-conversion efficiency solar cell of the present invention includes on a back surface, as a non-light receiving surface, of a first conductive type semiconductor substrate: a first conductive type diffusion layer where first conductive type impurities are diffused; a second conductive type diffusion layer where second conductive type impurities are diffused; and a high resistive layer or an intrinsic semiconductor layer formed between the first conductive type diffusion layer and the second conductive type diffusion layer. (2) At this time, anyone of a first electrode in contact with the first conductive type diffusion layer and a second electrode in contact with the second conductive type diffusion layer may also be in contact with the high resistive layer or the intrinsic semiconductor layer.

As thus described, since this inventive solar cell has a simple structure where the first conductive type diffusion layer and the second conductive type diffusion layer corresponding to the BSF layer and the emitter layer are separated from each other by the high resistive layer or the intrinsic semiconductor layer, it is possible to easily manufacture the solar cell with good yield at low cost. With the emitter layer and the BSF layer separated from each other by the high resistive layer or the intrinsic semiconductor layer, under an operating condition, namely when forward bias is applied, a leak current is interrupted to prevent reduction in parallel resistance, thereby making it possible to obtain a back contact type solar cell with good conversion efficiency. When reverse bias is applied, a current is uniformly leaked on the whole of the cell surface, which prevents the cell from becoming locally hot and critically damaged by ignition or the like, thereby to enhance the reliability. Moreover, at the time of forming the electrode on the emitter layer or the BSF layer, even if the formed position is displaced, the electrode is just in contact with the high resistive layer or the intrinsic semiconductor layer, thereby enabling prevention of reduction in parallel resistance.

(3) A level difference is provided on the back surface of the semiconductor substrate. When the back surface is viewed from above, anyone of the first conductive type diffusion layer and the second conductive type diffusion layer may be provided on an upper level and the other provided on a lower level, and the high resistive layer or the intrinsic semiconductor layer may be provided on the upper level. Accordingly, at the time of forming the electrode, especially at the time of forming the electrode on one conductive type diffusion layer on the lower level by the firing through technique, the electrode is hardly in contact with the upper level, and further, the high resistive layer or the intrinsic semiconductor layer is formed near the end of the upper level, thereby making it more unlikely for the electrode to be in contact with the other conductive type diffusion layer.

(4) When the back surface is viewed from above, the high resistive layer or the intrinsic semiconductor layer may, for example, be formed having a width to make a gap of not smaller than 1 μm and not larger than 100 μm between the first conductive type diffusion layer and the second conductive type diffusion layer. It is thereby possible to more reliably obtain an effect of improvement in conversion efficiency due to cutoff of the leak current.

(5) For example, the high resistive layer can be more easily formed by diffusing both the first conductive type impurities and the second conductive type impurities.

(6) A method for manufacturing a high photovoltaic-conversion efficiency solar cell according to the present invention is a method for manufacturing a solar cell, in which a second conductive type diffusion layer, where second conductive type impurities are diffused, is formed in a first region of a back surface, as a non-light receiving surface, of a first conductive type semiconductor substrate provided with the first region, a second region, and a third region, a first conductive type diffusion layer, where first conductive type impurities are diffused, is formed in the second region, and a high resistive layer, where the first conductive type impurities and the second conductive type impurities are diffused, is formed in the third region between the first region and the second region, the method comprising: a second impurity diffusing step of diffusing the second conductive type impurities on the entire back surface of the semiconductor substrate to form the second conductive type diffusion layer; a protective layer forming step of forming a protective layer on the second conductive type diffusion layer; a first protective layer removing step of removing a portion of the protective layer which covers the second region while tapering a thickness of a portion of the protective layer which covers the third region from an original thickness of the protective layer to almost 0, from a boundary with a portion covering the first region to a boundary with the portion covering the second region; a second conductive type diffusion layer removing step of removing the second conductive type diffusion layer that is exposed after removal of the protective layer, to expose the second region; a first impurity diffusing step of diffusing the first conductive type impurities in the second region and the third region via the portion where the protective layer tapers, to respectively form the first conductive type diffusion layer and the high resistive layer; and a second protective layer removing step of removing the remaining protective layer.

(7) Another method for manufacturing a high photovoltaic-conversion efficiency solar cell according to the present invention is a method for manufacturing a solar cell, in which a second conductive type diffusion layer, where second conductive type impurities are diffused, is formed in a first region of a back surface, as a non-light receiving surface, of a first conductive type semiconductor substrate provided with the first region, a second region, and a third region, a first conductive type diffusion layer, where first conductive type impurities are diffused, is formed in the second region, and a high resistive layer, where the first conductive type impurities and the second conductive type impurities are diffused, is formed in the third region between the first region and the second region, the method comprising: a first impurity diffusing step of diffusing the first conductive type impurities on the entire back surface of the semiconductor substrate to form the first conductive type diffusion layer; a protective layer forming step of forming a protective layer on the first conductive type diffusion layer; a first protective layer removing step of removing a portion of the protective layer which covers the second region while tapering a thickness of a portion of the protective layer which covers the third region from an original thickness of the protective layer to almost 0, from a boundary with a portion covering the first region to a boundary with the portion covering the second region; a first conductive type diffusion layer removing step of removing the first conductive type diffusion layer that is exposed after removal of the protective layer, to expose the second region; a second impurity diffusing step of diffusing the second conductive type impurities in the second region and the third region via the portion where the protective layer tapers, to respectively form the second conductive type diffusion layer and the high resistive layer; and a second protective layer removing step of removing the remaining protective layer.

In the solar cells manufactured by these manufacturing methods, the second conductive type diffusion layer as the emitter layer and the first conductive type diffusion layer as the BSF layer are separated from each other by the high resistive layer or the intrinsic semiconductor layer which can be easily formed with good yield. Hence in the case of an operating condition, namely when forward bias is applied, a leak current is interrupted to prevent reduction in parallel resistance, thereby making it possible to obtain a solar cell with high conversion efficiency. When reverse bias is applied, a current is uniformly leaked in the plane of the cell, which prevents the cell from becoming locally hot and critically damaged by ignition or the like, thereby to enhance the reliability. Moreover, at the time of forming the electrode on the emitter layer or the BSF layer, even if the formed position is displaced, the electrode is just in contact with the high resistive layer or the intrinsic semiconductor layer, thereby enabling prevention of reduction in parallel resistance.

(8) The protective layer can be removed and made thinner in the first protective layer removing step by, for example, applying etching paste to the portion of the protective layer which covers the second region or irradiating the same portion with laser. By applying etching paste to the portion covering the second region or irradiating the same portion with laser, an etching solution flowing out of the etching paste or energy of the laser is propagated to the portion covering the third region adjacent to the second region, and the energy continuously increases from the farthest propagated position to the boundary between the third region and the second region. Accordingly, not only the protective layer in the second region can be removed, but the protective layer in the third region can also be partially removed such that its thickness tapers from an original thickness of the protective layer to almost 0.

(9) The protective layer may be a silicon oxide layer, a silicon nitride layer, an impurity-containing glass layer, or a laminate formed by laminating two or more of these. Thus, for example by leaving the glass layer formed at the time of impurity diffusion as it is and using it as the protective layer, the solar cell can be more easily and economically manufactured by omitting the step of removing the glass layer.

(10) A plurality of high photovoltaic-conversion efficiency solar cells of the present invention may be connected to constitute a solar cell module.

(11) A photovoltaic power generation system may be constituted by using the solar cell modules formed by connecting a plurality of solar cells of the present invention.

DESCRIPTION OF EMBODIMENTS

Figure 1:
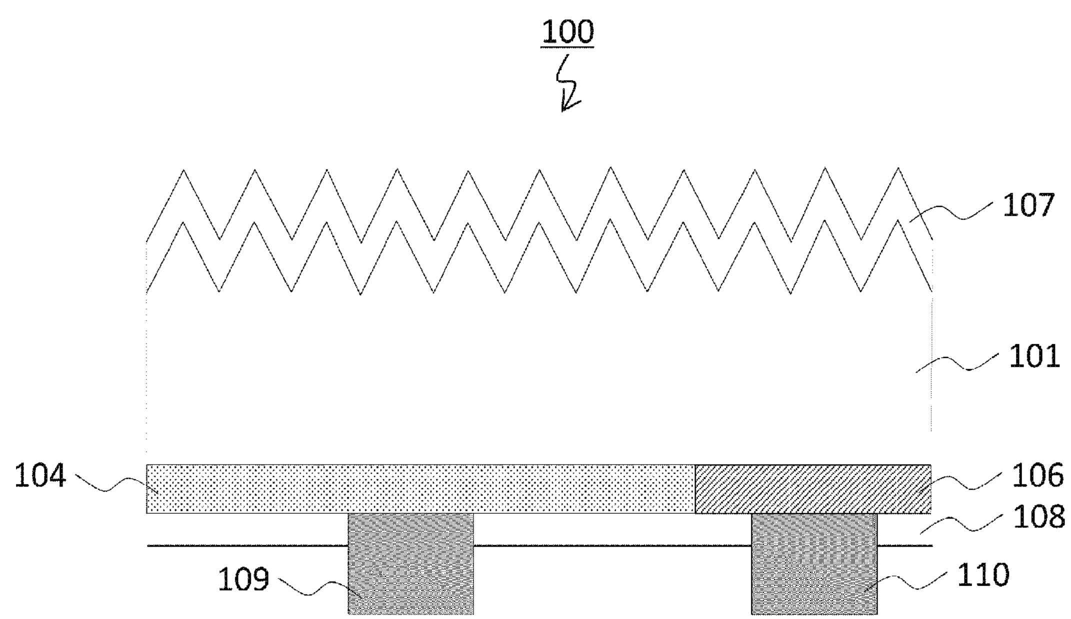
FIG. 1 is a view that illustrates one example of a configuration of a conventional back contact type solar cell.

Hereinafter, embodiments of the present invention will be described. A common constituent among the drawings including the drawing used for describing the prior art is provided with the same reference numeral.

First Embodiment

Figure 2A:
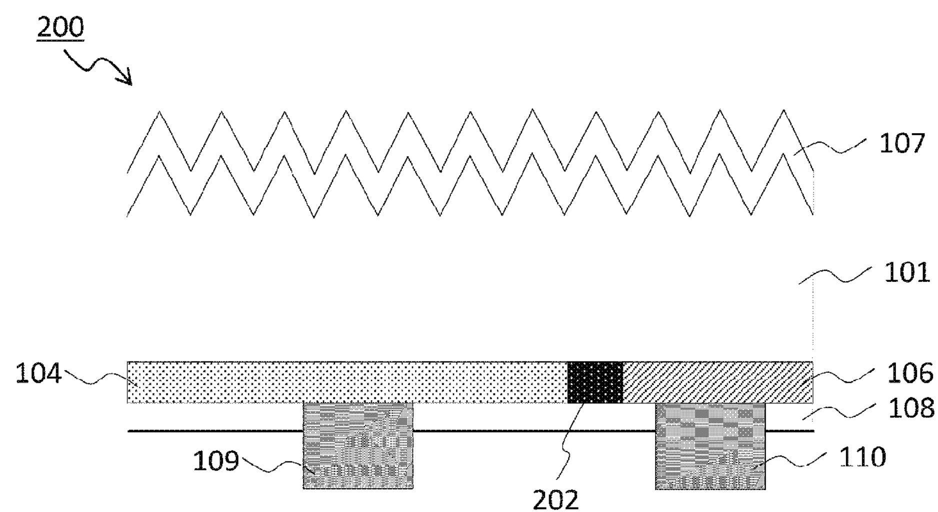
FIG. 2A and FIG. 2B are views that illustrate a configuration of a back contact type solar cell of the present invention.
Figure 3:
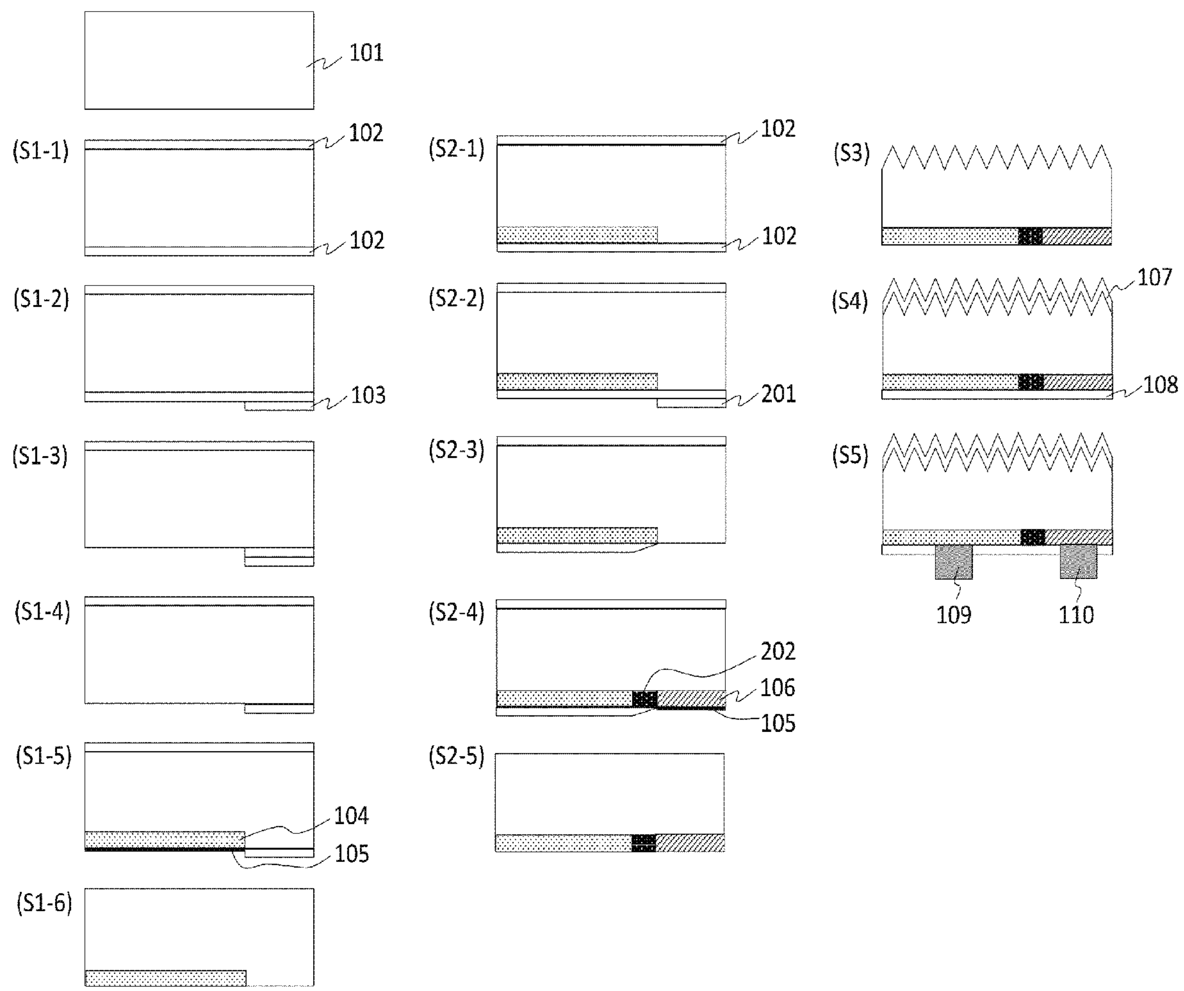
FIG. 3 is a flowchart that illustrates a method for manufacturing the back contact type solar cell of the present invention.

FIG. 2A illustrates a configuration of a back contact type solar cell 200 in the present invention. The back contact type solar cell 200 includes a semiconductor substrate 101, an emitter layer 104, a BSF layer 106, antireflection films with passivation properties 107, 108, electrodes 109, 110, and a high resistive layer 202. The back contact type solar cell 200 is obtained by forming the high resistive layer 202 between the emitter layer 104 and the BSF layer 106 of the conventional back contact type solar cell 100 illustrated in FIG. 1. Hereinafter, a manufacturing process for the back contact type solar cell 200 will be described with reference to FIG. 3.

The semiconductor substrate 101 is a main material for the back contact type solar cell 200, and made of single-crystalline silicon, multi-crystalline silicon, or the like. While either a p-type substrate or an n-type substrate may be used, in this text, a description will be given taking as an example the case of an n-type silicon substrate containing impurities such as phosphorus and having a resistivity of 0.1 to 4.0 Ω·cm. For the semiconductor substrate 101, a substrate in a plate shape with a size of 100 to 150 mm square and a thickness of 0.05 to 0.30 mm is preferred, and one main surface is used as a light receiving surface, and the other main surface is used as a non-light receiving surface (back surface).

Prior to manufacturing of the back contact type solar cell 200, the semiconductor substrate 101 is soaked into an acid solution or the like for damage etching, to remove damage on the surface caused by slicing or the like, and the semiconductor substrate 101 is then cleaned and dried.

The emitter layer 104 is formed on the back surface of the semiconductor substrate 101 after the damage etching (S1). First, a protective layer 102 such as a silicon oxide layer is formed on the entire surface of the semiconductor substrate 101 (S1-1). Specifically, a silicon oxide layer with a layer thickness of approximately 30 to 300 nm is formed by, for example, a thermal oxidation method in which the semiconductor substrate 101 is set in an oxygen atmosphere at a high temperature of 800 to 1100° C. Subsequently, by screen printing, resist paste is applied to the regions of the protective layer 102 other than regions for forming the emitter layer 104 on the back surface of the semiconductor substrate 101, and the resist paste is cured (S1-2). The semiconductor substrate 101 is then soaked into a hydrofluoric acid aqueous solution to remove the protective layer 102 covering the region for forming the emitter layer 104 (S1-3), and is further soaked into acetone or the like to remove the resist paste 103 (S1-4). Then, p-type impurities are diffused by, for example, the thermal diffusion method in the region where the protective layer 102 has been removed, to form the emitter layer 104 as a p-type diffusion layer and a glass layer 105 (S1-5). Specifically, for example by placing this semiconductor substrate 101 in a high temperature gas at 800 to 1100° C. containing $BBr_3$, boron is diffused in the regions not formed with the protective layer 102, to form the glass layer 105 and the emitter layer 104 with sheet resistance of approximately 20 to 300Ω/□. The semiconductor substrate 101 is then soaked into a chemical such as a diluted hydrofluoric acid solution to remove the remaining protective layer 102 and the glass layer 105, and cleaned by deionized water (S1-6). This leads to formation of the emitter layer 104 where p-type impurities are diffused in a desired region on the back surface of the semiconductor substrate 101.

Next, the BSF layer 106 and the high resistive layer 202 are formed on the back surface of the semiconductor substrate 101 in the following manner (S2).

The protective layer 102 such as a silicon oxide layer is formed on the entire surface of the semiconductor substrate 101 formed with the emitter layer 104 (S2-1). Specifically, a silicon oxide layer with a layer thickness of approximately 30 to 300 nm is formed by, for example, a thermal oxidation method in which the semiconductor substrate 101 is set in an oxygen atmosphere at a high temperature of 800 to 1100° C.

Subsequently, by screen printing, etching paste 201 for etching the protective layer 102 is applied to a region of the protective layer 102 which protects a region not formed with the emitter layer 104 on the back surface of the semiconductor substrate 101, and then the printed paste is heated to be dried (S2-2).

In this case, just after the printing and during the heating, an etching solution oozes from the printed paste. For this reason, when the etching paste 201 is removed by soaking the semiconductor substrate 101 applied with the etching paste 201 into a potassium hydroxide aqueous solution or by some other means, not only the thickness of the protective layer 102 becomes almost 0 in the region where the etching paste 201 has been printed, but also the thickness of the protective layer 102 on the emitter layer 104, adjacent to the area where the etching paste 201 has been printed, tapers from the thickness of the layer formation (S2-3). That is, an amount of the etching solution which has oozed from the printed paste gradually increases from the farthest reached region on the emitter layer 104 to the region applied with the etching paste 201. Hence, it is possible to form a portion with tapering from an original thickness of the formed layer to almost 0 in the protective layer 102.

Subsequently, in the region of the protective layer 102 with a thickness of almost 0 and the region of the protective layer 102 having the tapering thickness due to removal of the etching paste 201, n-type impurities are diffused by the thermal diffusion method, for example. Specifically, this semiconductor substrate 101 is set, for example, in a high temperature gas at 850 to 1100° C. containing $POCl_3$ or the like. Accordingly, in the region of the protective layer 102 with its thickness being almost 0, the glass layer 105 and the BSF layer 106 as an n-type diffusion layer with sheet resistance of approximately 30 to 300Ω/□ are formed. Simultaneously, in the region where the protective layer 102 tapers, the high resistive layer 202 is formed by mixing of boron previously diffused for formation of the emitter layer 104 and phosphorus diffused passing through the protective layer 102 reduced in thickness (S2-4). The sheet resistance of the high resistive layer 202 as thus formed is difficult to accurately measure, and it is estimated to be from several hundred to several thousand Ω/□ or larger, though depending on the mixture of the impurities.

The width of the high resistive layer 202 formed between the emitter layer 104 and the BSF layer 106 can be controlled by changing viscosity of the etching paste 201 to adjust an oozing amount. The width of the high resistive layer 202 needs to be at least 1 μm from the viewpoint of preventing a leak current between the emitter layer 104 and the BSF layer 106 and from the viewpoint of putting flexibility into the displacement of the formed electrodes. Meanwhile, the width of the high resistive layer 202 is preferably not larger than 100 μm from the viewpoint of ensuring the minimum area necessary for the emitter layer 104.

The semiconductor substrate 101 is then soaked into a chemical such as a diluted hydrofluoric acid solution to remove the remaining protective layer 102 and the glass layer 105, and cleaned by deionized water (S2-5). Thereby, the BSF layer 106 where the n-type impurities are diffused is formed in the region without the emitter layer 104 on the back surface of the semiconductor substrate 101, and the high resistive layer 202 where both the n-type impurities and the p-type impurities are diffused is formed between the emitter layer 104 and the BSF layer 106.

Subsequently, a concave-convex structure, which is called a texture, is formed on the light receiving surface of the semiconductor substrate 101 (S3). The texture can be formed by soaking the semiconductor substrate 101 in an acid or alkaline solution for a certain period of time. For example, the texture can be formed by applying resist paste to the entire back surface of the semiconductor substrate 101 by screen printing, curing the resist paste, and then chemically etching the semiconductor substrate 101 by use of a potassium hydroxide aqueous solution or the like, followed by cleaning and drying. By forming the texture, incident light from the light receiving surface multiply reflects to be confined in the semiconductor substrate 101, thereby enabling effective reduction in reflectance and improvement in conversion efficiency. Thereafter, the semiconductor substrate 101 is soaked into acetone or the like to remove the resist paste applied to the entire back surface of the semiconductor substrate 101. Note that the texture may be formed before formation of the emitter layer 104 and the BSF layer 106. The texture may also be formed on the back surface of the semiconductor substrate 101. In addition, an FSF (Front Surface Field) layer may further be formed on the light receiving surface of the semiconductor substrate 101.

Subsequently, the antireflection films with passivation properties 107, 108 made of SiN (silicon nitride) or the like are respectively formed on both surfaces of the semiconductor substrate 101 (S4). In the case of the silicon nitride layer, it is formed by, for example, a plasma CVD method where a mixed gas of $SiH_4$ and $NH_3$ is diluted by $N_2$ and plasma-gasified by glow discharge decomposition, or by some other method. Each of the antireflection films with passivation properties 107, 108 are formed such that a refractive index is approximately 1.8 to 2.3 and the thickness is approximately 50 to 100 nm in view of a difference in refractive index from the semiconductor substrate 101. This film performs the function of preventing the reflection of light on the front surface of the semiconductor substrate 101 and effectively absorbing the light in the semiconductor substrate 101, and also functions as a passivation layer having a passivation effect on the n-type diffusion layer, to exert the effect of improving electric characteristics of the solar cell. Note that the antireflection films with passivation properties 107, 108 may be a single-layered film of silicon oxide, silicon carbide, amorphous silicon, aluminum oxide, titanium oxide, or the like, or a laminated film formed by combining these. Different films may be used for the light receiving surface and the back surface of the semiconductor substrate 101.

Subsequently, the electrodes 109, 110 are formed (S5). The electrode may be formed by, for example, providing openings in the antireflection films with passivation properties 108 by etching paste or the like and performing sputtering, or may be formed by the screen printing method. In the case of using the screen printing method, first, conductive paste containing, for example, a silver powder, glass frit, or vanish is screen-printed on each of regions of the antireflection films with passivation properties 108 where the electrode 109 in contact with the emitter layer 104 is to be formed and regions thereof where the electrode 110 in contact with the BSF layer 106 are to be formed, and the conductive paste is then dried. The printed conductive paste is then fired at approximately 500° C. to 950° C. for approximately 1 to 60 seconds to penetrate the antireflection films with passivation properties 108 (firing through). This makes the sintered silver powder electrically connected with the emitter layer 104 or the BSF layer 106 to form the electrodes 109, 110. Note that the firing at the time of forming the electrode may be performed once or may be separately performed more than once. Further, the conductive paste to be applied onto the emitter layer 104 and the conductive paste to be applied onto the BSF layer 106 may be different.

Each of the electrodes is made up of bus bar electrodes for externally taking out a photo-generation current generated in the solar cell, and current-collecting finger electrodes in contact with these bus bar electrodes.

As seen from the above description, the high resistive layer 202 can be easily formed with good yield at low cost. Further, with this layer separating the emitter layer 104 and the BSF layer 106 from each other, under an operating condition, namely when forward bias is applied, a leak current is interrupted to prevent reduction in parallel resistance, thereby making it possible to obtain a solar cell with high conversion efficiency. When reverse bias is applied, a current is uniformly leaked on the whole of the cell surface, which prevents the cell from becoming locally hot and critically damaged by ignition or the like, thereby to enhance the reliability.

Figure 2B:
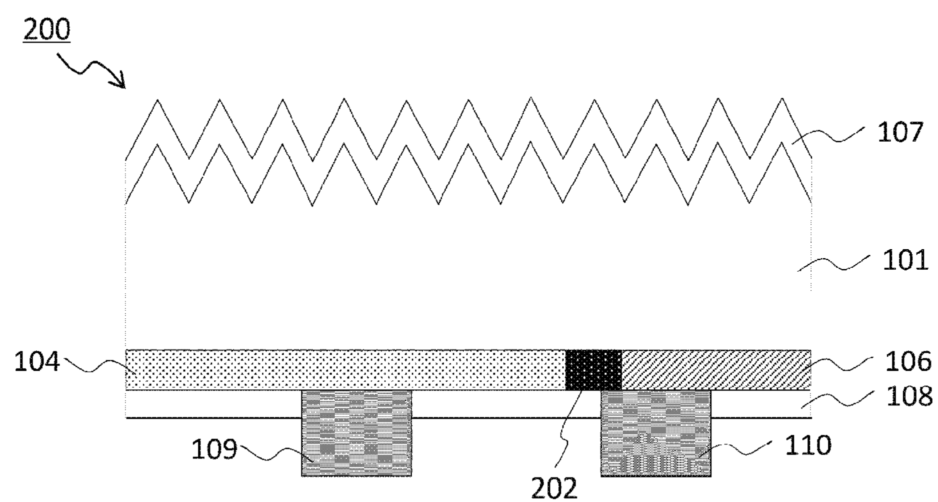

Moreover, at the time of forming the electrode 109 or 110 on either the emitter layer 104 or the BSF layer 106, even if the formed position is displaced, the electrode 109 or 110 is just in contact with the high resistive layer 202 as illustrated in FIG. 2B, thereby enabling prevention of reduction in parallel resistance which would occur owing to connection of the electrode 109 or 110 to the other layer.

As above, according to the configuration and the manufacturing method for the back contact type solar cell of the present invention, it is possible to easily provide a back contact type solar cell with good yield and excellent conversion efficiency at low cost by fewer steps than in the method for manufacturing the back contact type solar cell having the former structure.

Note that the region where the protective layer tapers can be formed by performing irradiation with laser in place of the method for applying the etching paste. That is, in the above embodiment, the portion of the protective layer 102 which covers the region of the semiconductor substrate 101 where the BSF layer 106 is to be formed is irradiated with laser, whereby the energy is injected into the portion of the protective layer 102, and the energy is also propagated to parts of the protective layer 102 which covers the emitter layer 104 adjacent to the region irradiated with laser. The propagation intensity of the energy continuously increases from the farthest energy reached position to the region irradiated with the energy, thereby enabling formation of the protective layer 102 with the tapering thickness. Note that the portion of the protective layer 102 which covers the region for forming the BSF layer 106 is irradiated with laser at a high fluence, and the portion of the protective layer 102 which covers the region for forming the high resistive layer

202 is irradiated with laser at a relatively low fluence, thereby allowing more accurate control of the layer thickness.

Adopting the method for removing the protective layer by laser irradiation enables omission of the step of printing, heating and drying the etching paste, which is complicated and costs high. That is, in the manufacturing process of FIG. 3, two steps of S2-2 and S2-3 can be performed by one step of performing irradiation with laser. This can further reduce the manufacturing cost.

Second Embodiment

Figure 4A:
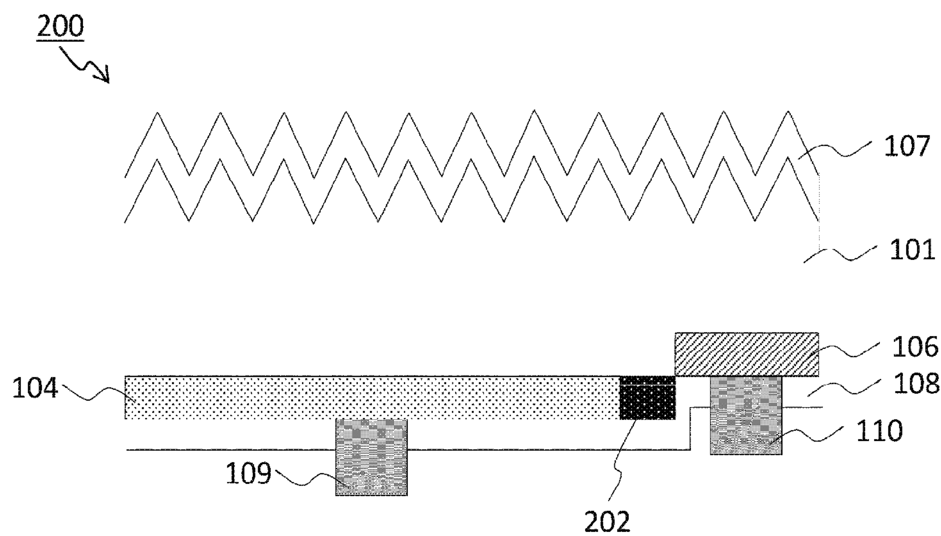
FIG. 4A and FIG. 4B are other views that illustrate the configuration of the back contact type solar cell of the present invention.
Figure 5:
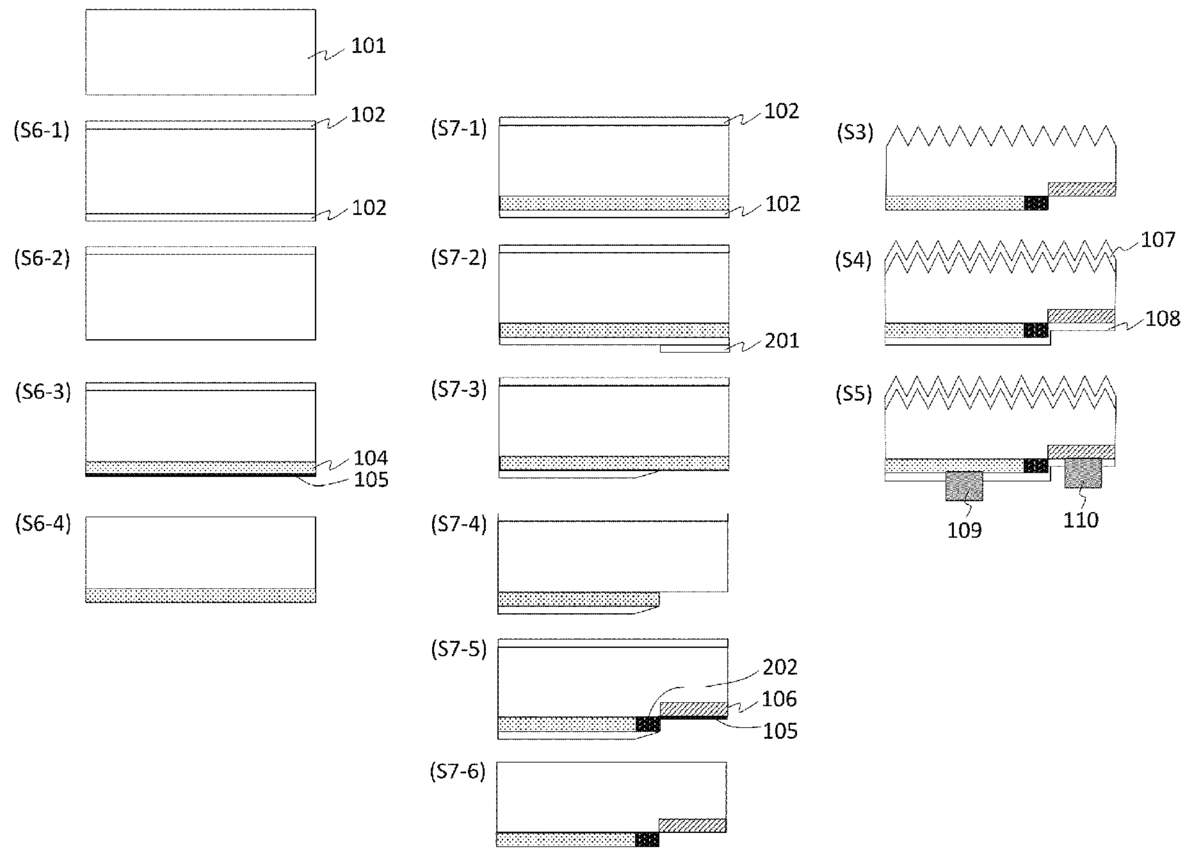
FIG. 5 is another flowchart that illustrates the method for manufacturing the back contact type solar cell of the present invention

In the manufacturing method of the first embodiment, the emitter layers are formed on parts of the back surface of the semiconductor substrate, and thereafter the BSF layers are formed in the regions not formed with the emitter layer on the back surface. However, the emitter layer may be once formed on the entire back surface of the semiconductor substrate, and thereafter the emitter layer in a regions where the BSF layers are to be formed may be removed by alkali etching or the like to form the BSF layers in the removed regions. FIG. 4A illustrates a configuration of the back contact type solar cell 200 manufactured by a manufacturing method of the second embodiment, and FIG. 5 illustrates a manufacturing process thereof.

The semiconductor substrate 101 may be either a p-type substrate or an n-type substrate as in the first embodiment. In this context, a description will be given taking the case of the n-type silicon substrate as an example. First, the emitter layer 104 is formed on the entire back surface in the following manner (S6). The protective layers 102 are formed on the entire surfaces of the semiconductor substrate 101 after the damage etching (S6-1), and the protective layer on the entire back surface is removed (S6-2). Subsequently, the p-type impurities are diffused on the entire back surface, to form the emitter layer 104 as the p-type diffusion layer and the glass layer 105 (S6-3), and the protective layer 102 and the glass layer 105 are removed (S6-4). This enables formation of the emitter layer 104 on the entire back surface of the semiconductor substrate 101.

Next, the BSF layer 106 and the high resistive layer 202 are formed on the back surface of the semiconductor substrate 101 in the following manner (S7). First, the protective layers 102 are formed on each surface of the semiconductor substrate 101 with the entire back surface formed with the emitter layer 104 (S7-1).

Subsequently, the etching paste 201 is applied by screen printing to regions of the protective layer 102, which covers a region for forming the BSF layer 106, and is then heated to be dried (S7-2). At this time, from the printing to the heating, an etching solution oozes from the printed paste.

For this reason, when the etching paste 201 is removed by soaking the semiconductor substrate 101 applied with the etching paste 201 into a potassium hydroxide aqueous solution or by some other means, not only the thickness of the protective layer 102 becomes almost 0 in the region where the etching paste 201 has been printed, but also the thickness of the protective layer 102 on the emitter layer 104, adjacent to the area where the etching paste 201 has been printed, tapers from the thickness of the layer formation (S7-3). That is, since an amount of the etching solution having oozed from the printed paste and reached the emitter layer 104 gradually increases from the farthest reached position on the emitter layer 104 to the position applied with the etching paste 201. Hence it is possible to form a portion with tapering from an original thickness of the formed layer to almost 0 in the protective layer 102.

Subsequently, the emitter layer 104 formed in the region of the semiconductor substrate 101 for forming the BSF layer 106 is removed by alkali etching or the like (S7-4). Then, in the region where the emitter layer 104 of the semiconductor substrate 101 has been removed and the region where the protective layer 102 tapers, the n-type impurities are diffused by the thermal diffusion method, for example. Thereby, in the region where the emitter layer 104 has been removed, the BSF layer 106 as the n-type diffusion layer and the glass layer 105 are formed. Simultaneously, the region where the protective layer 102 tapers is formed with the high resistive layer 202 obtained by mixing of boron previously diffused for formation of the emitter layer 104 and phosphorus diffused passing through the protective layer 102 reduced in thickness (S7-5). The remaining protective layer 102 and the glass layer 105 are then removed (S7-6). Thereby, the BSF layer 106 where the n-type impurities are diffused is formed in the region not formed with the emitter layer 104 on the back surface of the semiconductor substrate 101, and the high resistive layer 202 where both the n-type impurities and the p-type impurities are diffused is formed between the emitter layer 104 and the BSF layer 106.

According to the method of the second embodiment, since the step of patterning the resist for partially forming the emitter layer becomes unnecessary, the step can be eliminated from the method of the first embodiment, to reduce the manufacturing cost more.

Figure 4B:
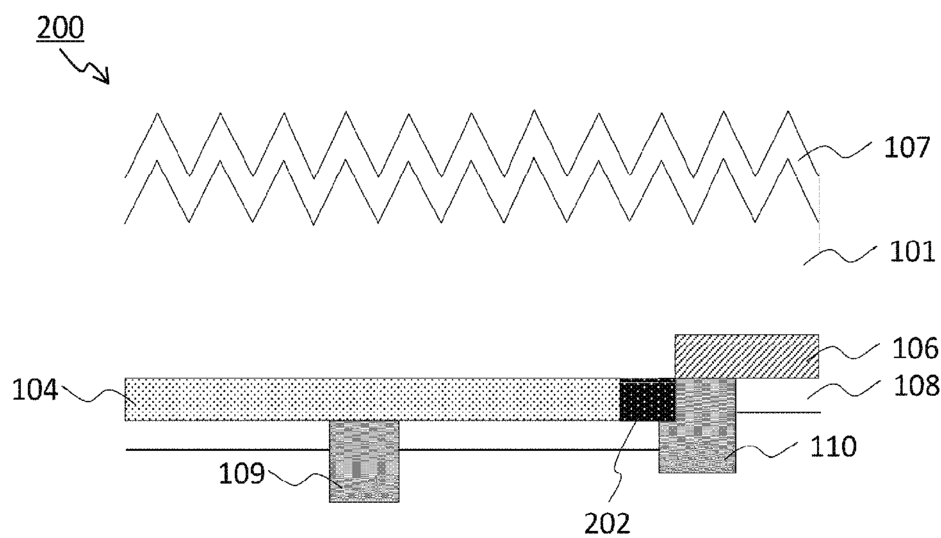

In this method, since the emitter layer is once formed on the entire back surface of the semiconductor substrate and then the emitter layer in the portion for forming the BSF layer is removed, a level difference occurs between the region where the emitter layer has been removed (i.e., the region where the BSF layer has been formed) and the region where the emitter layer has not been removed (i.e., the region where the emitter layer and the high resistive layer has been formed), as illustrated in FIG. 4A. Specifically, when the back surface is seen from above, the emitter layer and the high resistive layer are formed on the upper level and the BSF layer is formed on the lower level, being adjacent to the high resistive layer. With the level difference formed as thus described, at the time of forming the electrode, especially at the time of forming the electrode on the BSF layer on the lower level by the firing through technique, the electrode is hardly in contact with the upper level, and further, the high resistive layer is formed near the end of the upper level viewed from the BSF layer, thereby making it more unlikely for the electrode to be in contact with the emitter layer (cf. FIG. 4B).

In this context, the method has been illustrated where the emitter layer is once formed on the entire back surface of the semiconductor substrate, and thereafter the emitter layer in the region where the BSF layer is to be formed is removed to form the BSF layer in the emitter layer removed place. However, the emitter layer may be once formed on the entire back surface of the semiconductor substrate, and thereafter the BSF layer in the region where the emitter layer is to be formed may be removed to form the emitter layer in the BSF layer removed place. In this case, when the back surface is seen from above, the BSF layer and the high resistive layer are formed on the upper level and the emitter layer is formed on the lower level, being adjacent to the high resistive layer.

MODIFIED EXAMPLES

Although the semiconductor substrate has been the n-type silicon substrate in each of the above embodiments, when the semiconductor substrate is a p-type silicon substrate, the emitter layer may be made of the n-type diffusion layer and the BSF layer may be made of the p-type diffusion layer.

Although the case has been illustrated in each of the above embodiments where the high resistive layer is formed between the emitter layer and the BSF layer, the intrinsic semiconductor layer may be provided in place of the high resistive layer. Since the intrinsic semiconductor has a very low carrier density, as in the case of providing the high resistive layer, it is possible to prevent a leak current from flowing between the emitter layer and the BSF layer. Moreover, at the time of forming the electrode on either the emitter layer or the BSF layer, even if the formed position is displaced, the electrode is just in contact with the intrinsic semiconductor layer due to the existence of the intrinsic semiconductor layer, thereby enabling prevention of reduction in parallel resistance which would occur owing to connection of the electrode to the other layer.

Although the case has been illustrated in each of the above embodiments where the protective layer is the silicon oxide layer, it is not necessarily the silicon oxide layer, but it may, for example, be a silicon nitride layer, a glass layer containing impurities and formed at the time of diffusion in advance, or a laminate of those. In the case of the protective layer being the silicon nitride layer, when the protective layer is formed by, for example, the plasma CVD method, it does not need to be heated at a high temperature, thereby preventing contamination by a lifetime killer which occurs in the case of heating at a high temperature. Further, using the glass layer, formed at the time of diffusing impurities, as it is as the protective layer can omit the step of forming the protective layer, to thereby reduce the manufacturing cost more.

Figure 6:
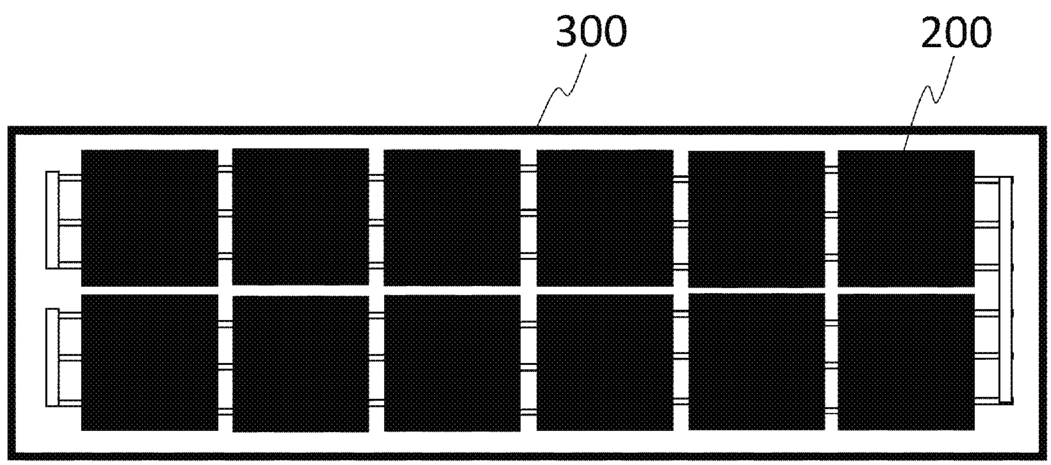
FIG. 6 is a schematic view that illustrates a configuration example of a solar cell module configured using the back contact type solar cells of the present invention
Figure 7:
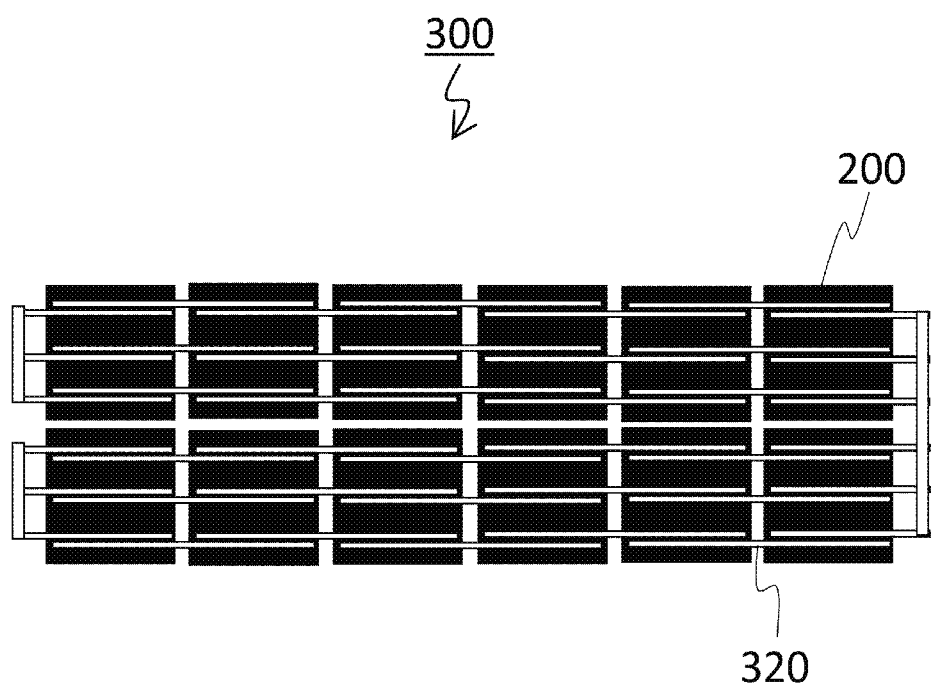
FIG. 7 is a schematic view that illustrates a configuration example of aback surface of the solar cell module illustrated in FIG. 6
Figure 8:
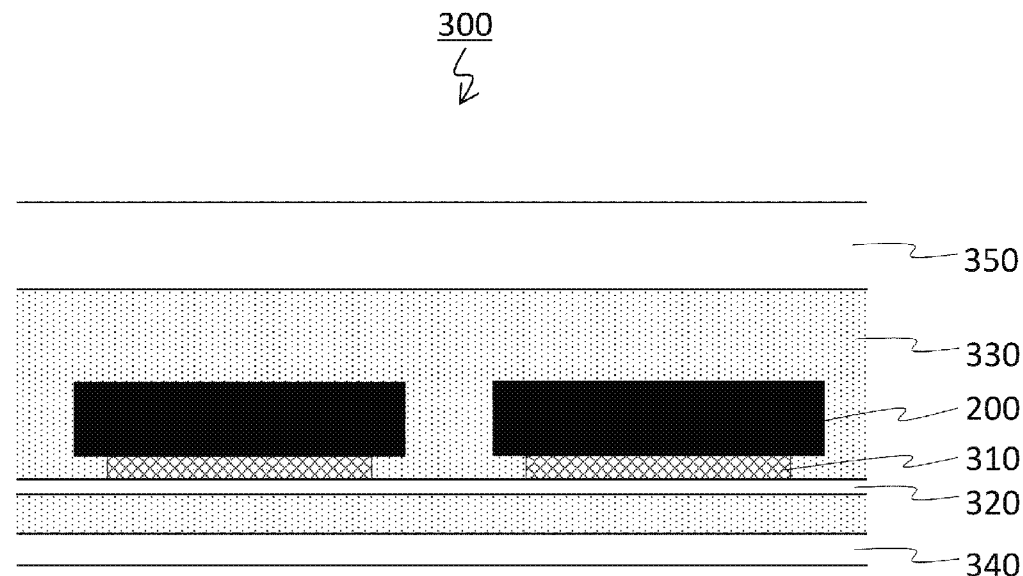
FIG. 8 is a schematic view that illustrates a configuration example of a cross section of the solar cell module illustrated in FIG. 6.

The back contact type solar cell produced in accordance with each of the above embodiments can be used for a solar cell module. FIG. 6 is a schematic view that illustrates a configuration example of a solar cell module 300. The solar cell module 300 has a structure where a plurality of back contact type solar cells 200 are spread in the form of tiles. As for the plurality of back contact type solar cells 200, each several to several tens of mutually adjacent cells are electrically connected in series to constitute a serial circuit called a string. FIG. 7 illustrates an overview of the string. FIG. 7 corresponds to a schematic view of the internal back surface side of the solar cell module 300 which is normally unseen. In FIG. 7, fingers and bus bars are omitted for the sake of clarifying the description. For constituting the serial circuit, a P bus bar and an N bus bar of the mutually adjacent back contact type solar cells 200 are connected by lead wires 320. FIG. 8 illustrates a sectional schematic view of the solar cell module 300. As described above, the string is configured by connecting the plurality of back contact type solar cells 200 by connection of the lead wires 320 to the bus bars 310. The string is sealed typically by a translucent filler 330 such as EVA (ethylene vinyl acetate), the non-light receiving surface (back surface) side is covered by a weatherproof resin film 340 such as PET (polyethylene terephthalate), and the light receiving surface is covered by a light receiving surface protecting material 350 having translucency and high mechanical strength, such as soda-lime glass. As the filler 330, polyolefin, silicone, or the like can be used other than EVA.

Figure 9:
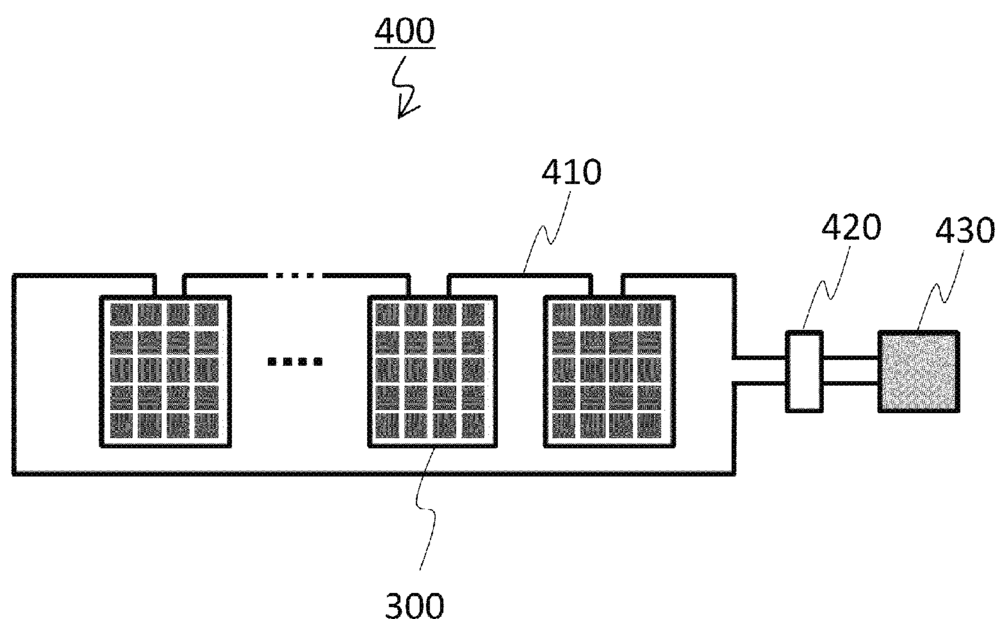
FIG. 9 is a schematic view that illustrates a configuration example of a photovoltaic power generation system configured using the solar cell modules illustrated in FIG. 6.

A plurality of solar cell modules can be connected to constitute the photovoltaic power generation system. FIG. 9 is a schematic view that illustrates a configuration example of a photovoltaic power generation system 400 formed by coupling a plurality of solar cell modules 300 made up of a plurality of back contact type solar cells 200 of the present invention. The photovoltaic power generation system 400 is formed by coupling a plurality of solar cell modules 300 in series by wiring 410 and supplies generated power to an external load circuit 430 through an inverter 420. Although not illustrated in FIG. 9, the photovoltaic power generation system may further include a secondary battery for storing the generated power.

The present invention is not restricted to the above embodiments and modified examples. The embodiments are illustrative, and one which has substantially the same configuration as the technical idea recited in the claims and exerts a similar function effect thereto is included in the technical scope of the present invention even if any change has been made.

EXAMPLES

The effect of the present invention was evaluated using products manufactured by methods shown in the following examples and comparative examples.

An n-type silicon substrate, doped with phosphorus and produced by slicing to have a thickness of 0.2 mm, and made of n-type single-crystalline silicon with a resistivity of about 1 Ω·cm, was prepared, and subjected to outside diameter processing, to be formed into a square plate shape with a side length of 15 cm. This substrate was soaked in a fluonitric acid solution for 15 seconds to be subjected to damage etching, and thereafter cleaned with deionized water and dried.

Comparative Example 1

In Comparative Example 1, a back contact type solar cell was manufactured by the conventional method. Specifically, after performing the following step, first and second common steps described later were performed.

The n-type silicon substrate after the damage etching was set in an oxygen atmosphere and thermally oxidized at a temperature of 1000° C. for 120 minutes, to form a silicon oxide layer on each surface of the substrate with a thickness of 70 nm. Then, the resist paste was screen-printed on a region at which the BSF layer was to be formed of the silicon oxide layer formed on the back surface of the substrate, and heated at a temperature of 100° C. to be dried. In this context, with the emitter layer having a width of 800 μm and the BSF layer having a width of 200 μm, a screen printing plate was formed in such a pattern as to have a structure of an interdigitated back contact cell where the emitter layers and the BSF layers were alternately formed. As the resist paste, Paste 185 manufactured by Lektrachem Ltd. was used. The substrate was soaked into a 2% hydrofluoric acid aqueous solution to partially remove the silicon oxide layer while leaving the layer on the region at which the BSF layer was to be formed, and then soaked into acetone to remove the resist paste, and thereafter, the substrate was cleaned with deionized water and dried. Next, thermal diffusion treatment was performed on the back surface of the substrate in a $BBr_3$ gas atmosphere at a temperature of 900° C. for 20 minutes, to form a p-type diffusion layer as the emitter layer and a glass layer on the back surface of the substrate. The formed p-type diffusion layer had a sheet resistance of about 70Ω/□ and a diffusion depth of 0.5 μm. Thereafter, this substrate was soaked into a 25% hydrofluoric acid aqueous solution, and then cleaned with deionized water and dried to remove the silicon oxide layer and the glass layer.

The substrate formed with the emitter layer as described above was set in an oxygen atmosphere and thermally oxidized in at a temperature of 1000° C. for 120 minutes, to form a silicon oxide layer on each surface of the substrate with a thickness of 70 nm. Then, the resist paste was screen-printed on the emitter layer formed place of the silicon oxide layer formed on the back surface of the substrate, and heated at a temperature of 100° C. to be dried. In this context, as the resist paste, Paste 185 manufactured by Lektrachem Ltd. was used. The substrate was soaked into a 2% hydrofluoric acid aqueous solution to partially remove the silicon oxide layer while leaving the layer on the emitter layer formed place, and then soaked into acetone to remove the resist paste.

Example 1

In Example 1, a back contact type solar cell was manufactured by the method of the first embodiment. Specifically, after performing the following step, first and second common steps described later were performed.

The substrate formed with the emitter layer as in Comparative Example 1 was set in an oxygen atmosphere and thermally oxidized at a temperature of 1000° C. for 120 minutes, to form a silicon oxide layer on each surface of the substrate with a thickness of 70 nm. Then, the etching paste was screen-printed on a region at which the BSF layer was to be formed of the silicon oxide layer formed on the back surface of the substrate, the region being not formed with the emitter layer, and heated at a temperature of 300° C. to be dried. In this context, as the etching paste, paste SolarEtch (register trademark) BES Type 10, manufactured by Merck Ltd., was used. Thereafter, the substrate was soaked into a solution containing 1% of potassium hydroxide, to remove the etching paste. By this technique, immediately below the etching paste printed region, namely in the region at which the BSF layer was to be formed not formed with the emitter layer, the silicon oxide layer was removed and the layer thickness became almost 0 nm. Further, due to the etching solution having oozed from the printed etching paste, the silicon oxide layer on the emitter layer tapered in thickness from 70 nm to 0 nm over a length of 30 μm from the printed portion to each end of the place.

Example 2

In Example 2, a back contact type solar cell was manufactured by the method of the second embodiment. Specifically, after performing the following step, first and second common steps described later were performed.

The thermal diffusion treatment was performed on the entire back surface of the n-type silicon substrate after the damage etching in a $BBr_3$ gas atmosphere at a temperature of 900° C. for 20 minutes, to form a p-type diffusion layer as the emitter layer and a glass layer. The formed p-type diffusion layer had a sheet resistance of about 70Ω/□ and a diffusion depth of 0.5 μm. This substrate was soaked into a 25% hydrofluoric acid aqueous solution, and then cleaned with deionized water and dried to remove the glass layer. The substrate where the glass layer has been removed was set in an oxygen atmosphere and thermally oxidized at a temperature of 1000° C. for 120 minutes, to form a silicon oxide layer on each surface of the substrate with a thickness of 70 nm. Then, the etching paste was screen-printed on a region where the BSF layer was to be formed in the silicon oxide layer formed on the back surface of the substrate, and heated at a temperature of 300° C. to be dried. In this context, as the etching paste, paste SolarEtch (register trademark) BES Type 10, manufactured by Merck Ltd., was used. Thereafter, the substrate was soaked into a solution containing 1% of potassium hydroxide, to remove the etching paste. This substrate was soaked in a solution containing 25% of potassium hydroxide at 70° C. for five minutes to remove by chemical etching the p-type diffusion layer remaining in the region where the BSF layer was to be formed, and thereafter, the substrate was cleaned with deionized water and dried. By this technique, immediately below the etching paste printed place, namely in the region where the BSF layer was to be formed, the silicon oxide layer had a thickness of 0 nm and was lower than the emitter layer formed place, thereby forming a level difference. Further, due to the etching solution having oozed from the etching paste after printed, the silicon oxide layer on the emitter layer tapered in thickness from 70 nm to 0 nm over a length of 30 μm from the etching paste printed portion to each end of the place.

Example 3

In Example 3, in the step of removing the protective layer of the second embodiment, a method of performing irradiation with laser was adopted in place of the method for applying the etching paste, to manufacture a back contact type solar cell. Specifically, after performing the following step, first and second common steps described later were performed.

The thermal diffusion treatment was performed on the entire back surface of the n-type silicon substrate after the damage etching in a $BBr_3$ gas atmosphere at a temperature of 900° C. for 20 minutes, to form a p-type diffusion layer as the emitter layer and a glass layer. The formed p-type diffusion layer had a sheet resistance of about 70Ω/□ and a diffusion depth of 0.5 μm. This substrate was soaked into a 25% hydrofluoric acid aqueous solution, and then cleaned with deionized water and dried to remove the glass layer. The substrate where the glass layer has been removed was set in an oxygen atmosphere and thermally oxidized at a temperature of 1000° C. for 120 minutes, to form a silicon oxide layer on each surface of the substrate with a thickness of 70 nm. Then, a region where the BSF layer was to be formed in the silicon oxide layer formed on the back surface of the substrate was irradiated with laser at a fluence of 2 $J/cm^2$. In this context, as laser irradiation equipment, Powerline E25/SHG manufactured by ROFIN-SINAR Technologies Inc. was used. The substrate after the laser irradiation was soaked in a solution containing 25% of potassium hydroxide at 70° C. for five minutes to remove by chemical etching the p-type diffusion layer remaining in the region where the BSF layer was to be formed, and thereafter, the substrate was cleaned with deionized water and dried. By this technique, immediately below the place irradiated with laser, namely in the region at which the BSF layer was to be formed, the silicon oxide layer had a thickness of 0 nm and was lower than the emitter layer formed place, thereby forming a level difference. Further, due to the energy propagated from the place immediately below the laser irradiation portion, the silicon oxide layer on the emitter layer tapered in thickness from 70 nm to 0 nm over a length of 30 μm from the laser irradiation portion to each end of the place.

COMPARATIVE EXAMPLE 2

Comparative Example 2 is similar to Example 3 except that the irradiation was performed with laser at a fluence of 0.6 J/cm$^2$. As a result of the laser irradiation, due to the energy propagated from the place immediately below the laser irradiation portion, the silicon oxide layer on the emitter layer tapered in thickness from 70 nm to 0 nm over a length of 0.5 μm from the laser irradiation portion to each end of the place.

Example 4

Example 4 is similar to Example 3 except that the irradiation was performed with laser at a fluence of 0.9 J/cm$^2$. As a result of the laser irradiation, due to the energy propagated from the place immediately below the laser irradiation portion, the silicon oxide layer on the emitter layer tapered in thickness from 70 nm to 0 nm over a length of 1 μm from the laser irradiation portion to each end of the place.

Example 5

Example 5 is similar to Example 3 except that the irradiation was performed with laser at a fluence of 4 J/cm$^2$. As a result of the laser irradiation, due to the energy propagated from the place immediately below the laser irradiation portion, the silicon oxide layer on the emitter layer tapered in thickness from 70 nm to 0 nm over a length of 100 μm from the laser irradiation portion to each end of the place.

Comparative Example 3

Comparative Example 3 is similar to Example 3 except that the irradiation was performed with laser at a fluence of 5.5 J/cm$^2$. As a result of the laser irradiation, due to the energy propagated from the place immediately below the laser irradiation portion, the silicon oxide layer on the emitter layer tapered in thickness from 70 nm to 0 nm over a length of 150 μm from the laser irradiation portion to each end of the place.

Example 6

Example 6 is similar to Example 2 except that the silicon oxide layer was formed without removing the glass layer after formation of the emitter layer. Specifically, after performing the following step, first and second common steps described later were performed.

The thermal diffusion treatment was performed on the entire back surface of the n-type silicon substrate after the damage etching in a $BBr_3$ gas atmosphere at a temperature of 900° C. for 20 minutes, to form a p-type diffusion layer as the emitter layer and a glass layer on the back surface of the substrate. Thereafter, while the substrate was kept in a furnace, only gas was replaced to set an oxygen atmosphere, and the substrate was thermally oxidized at a temperature of 1000° C. for 120 minutes, to further form a silicon oxide layer on the glass layer. The formed p-type diffusion layer had a sheet resistance of about 80Ω/□ and a diffusion depth of 1.0 μm, and a glass layer to serve as the protective layer and the silicon oxide layer were formed as laminate with a total layer thickness of 100 nm. Then, the etching paste was screen-printed on a region where the BSF layer was to be formed in the laminate of the silicon oxide layer and the glass layer formed on the back surface of the substrate, and heated at a temperature of 300° C. to be dried. In this context, as the etching paste, paste SolarEtch (register trademark) BES Type 10, manufactured by Merck Ltd., was used. Thereafter, the substrate was soaked into a solution containing 1% of potassium hydroxide, to remove the etching paste. This substrate was soaked in a solution containing 25% of potassium hydroxide at 70° C. for five minutes to remove by chemical etching the p-type diffusion layer remaining in the region where the BSF layer was to be formed, and thereafter, the substrate was cleaned with deionized water and dried. By this technique, immediately below the etching paste printed place, namely in the region where the BSF layer was to be formed, the laminate of the glass layer and the silicon oxide layer had a thickness of 0 nm and was lower than the emitter layer formed region, thereby forming a level difference. Further, due to the etching solution having oozed from the etching paste after printed, the laminate made of the glass layer and the silicon oxide layer on the emitter layer tapered in thickness from 100 nm to 0 nm over a length of 30 μm from the etching paste printed portion to each end of the place.

<First Common Step>

On the back surface of each of the substrates obtained through the steps shown in Comparative Examples 1 to 3 and Examples 1 to 6 described above, the thermal diffusion treatment was performed in a $POCl_3$-gas atmosphere at a temperature of 930° C. for 20 minutes, to diffuse phosphorus in the region where the silicon oxide layer had been removed and form a glass layer and an n-type diffusion layer as the BSF layer. The formed n-type diffusion layer had a sheet resistance of about 30Ω/□ and a diffusion depth of 0.5 μm. Further, in each of Example 1 to Example 6, phosphorus is also diffused to the emitter layer from the region where the silicon oxide layer tapers, thereby forming a high resistive layer with boron and phosphorus mixed therein. The sheet resistance of this high resistive layer could not be measured accurately, but was not smaller than 1000Ω/□. Thereafter, these substrates were soaked into a 25% hydrofluoric acid aqueous solution, and then cleaned with deionized water and dried to remove the silicon oxide layer and the glass layer.

Example 7

Example 7 was manufactured in a similar procedure to Example 3, but different from Example 3 in that the emitter layer and the high resistive layer were formed after formation of the BSF layer, whereas in Example 3, the BSF layer and the high resistive layer were formed after formation of the emitter layer. Specifically, after performing the following step, a second common step described later was performed.

The thermal diffusion treatment was performed on the entire back surface of the n-type silicon substrate after the damage etching in a $POCl_3$ gas atmosphere at a temperature of 930° C. for 20 minutes, to form an n-type diffusion layer as the BSF layer and a glass layer. The formed n-type diffusion layer had a sheet resistance of about 30Ω/□ and a diffusion depth of 0.5 μm. Thereafter, this substrate was soaked into a 25% hydrofluoric acid aqueous solution, and then cleaned with deionized water and dried to remove the silicon oxide layer and the glass layer. The substrate where the glass layer has been removed was set in an oxygen atmosphere and thermally oxidized at a temperature of 1000° C. for 120 minutes, to form a silicon oxide layer on each surface of the substrate with a thickness of 70 nm. Then, a region where the emitter layer was to be formed in the silicon oxide layer formed on the back surface of the substrate was irradiated with laser at a fluence of 2 J/cm$^2$. In this context, as laser irradiation equipment, Powerline E25/SHG manufactured by ROFIN-SINAR Technologies Inc. was used. The substrate after the laser irradiation was soaked in a solution containing 25% of potassium hydroxide at 70° C. for five minutes to remove by chemical etching the n-type diffusion layer remaining in the region where the emitter layer was to be formed, and thereafter, the substrate was cleaned with deionized water and dried. By this technique, immediately below the place irradiated with laser, namely in the region where the emitter layer was to be formed, the silicon oxide layer had a thickness of 0 nm and lower than the BSF layer formed region, thereby forming a level difference. Further, due to the energy propagated from the place immediately below the laser irradiation portion, the silicon oxide layer on the BSF layer tapered in thickness from 70 nm to 0 nm over a length of 30 μm from the laser irradiation portion to each end of the place. Subsequently, the thermal diffusion treatment was performed on the back surface of the substrate in a $BBr_3$ gas atmosphere at a temperature of 930° C. for 20 minutes, to diffuse boron in the region where the silicon oxide layer had been removed, and form a p-type diffusion layer as the emitter layer and a glass layer. The formed p-type diffusion layer had a sheet resistance of about 80Ω/□ and a diffusion depth of 1.0 μm. Further, boron was also diffused to the BSF layer from the region where the silicon oxide layer tapers, thereby forming a high resistive layer with boron and phosphorus mixed therein. Thereafter, this substrate was soaked into a 25% hydrofluoric acid aqueous solution, and then cleaned with deionized water and dried to remove the silicon oxide layer and the glass layer.

<Second Common Step>

The resist paste was screen-printed on the entire back surface of the substrate formed with the emitter layer, the BSF layer, and the high resistive layer by the steps shown in each of Comparative Examples 1 to 3 and Examples 1 to 7, and the substrate was heated at a temperature of 100° C. to be dried. In this context, as the resist paste, Paste 185 manufactured by Lektrachem Ltd. was used. The substrate was soaked in a solution containing 2% of potassium hydroxide and 2% of IPA at 70° C. for five minutes, and then cleaned with deionized water and dried to form a texture structure on the light receiving surface of the substrate. Thereafter, the substrate was soaked into acetone to remove the resist paste.

Next, by the plasma CVD method using $SiH_4$, $NH_3$, and $N_2$, silicon nitride films, to be the antireflection films with passivation properties, were formed having a thickness of 100 nm on the light receiving surface and the back surface of the substrate.

The conductive silver paste was printed on the emitter layer of the substrate, subjected to the above treatment so far, by using the screen printing method and then dried at 150° C. The conductive silver paste was printed on the BSF layer of the substrate by using the screen printing method and then dried at 150° C. In this case, in each of Comparative Examples 1, 2, a place where the electrode was displaced and protruded from the BSF layer to the emitter layer was found. Meanwhile, in each of Examples 1 to 7, a place where the electrode was displaced and protruded on the high resistive layer between the BSF layer and the emitter layer was found. In this context, as the conductive silver paste, SOL9383M manufactured by Heraeus Holding, was used. The conductive paste printed as above was then fired at the maximum temperature of 800° C. for five seconds to produce the back contact type solar cell according to each of the comparative examples and examples.

<Implementation Results>

Table 1 shows an average conversion efficiency, an average short circuit current density, an average open voltage, and an average fill factor, of each 100 back contact type solar cells produced by each of the methods of Comparative Examples 1 to 3 and Examples 1 to 7 described above.

TABLE 1

| | Average conversion efficiency (%) | Average short circuit current density (mA/cm$^2$) | Average open voltage (V) | Average fill factor (%) |
|---|---|---|---|---|
| Example 1 | 19.7 | 38.7 | 0.645 | 79.1 |
| Example 2 | 19.8 | 38.7 | 0.646 | 79.3 |
| Example 3 | 19.8 | 38.6 | 0.647 | 79.2 |
| Example 4 | 19.8 | 38.7 | 0.647 | 79.1 |
| Example 5 | 19.7 | 38.5 | 0.646 | 79.4 |
| Example 6 | 20.0 | 38.8 | 0.648 | 79.5 |
| Example 7 | 19.9 | 38.7 | 0.648 | 79.4 |
| Comparative Example 1 | 19.1 | 38.3 | 0.641 | 77.9 |
| Comparative Example 2 | 19.3 | 38.4 | 0.643 | 78.3 |
| Comparative Example 3 | 19.4 | 38.1 | 0.642 | 79.5 |

As shown in Table 1, any of the characteristic values was high in the examples having the structure of the present invention as compared with Comparative Example 1 in accordance with the conventional structure. In comparison of the respective characteristic values of Examples 3 to 5 and Comparative Examples 2, 3, where the width of the high resistive layers are different from each other, in case that the width of the high resistive layer is smaller than 1 μm as in Comparative Example 2, reduction in parallel resistance cannot be prevented to cause a decrease in fill factor, and in contrast, in case that the width of the high resistive layer is larger than 100 μm as in Comparative Example 3, a short circuit current decreases due to a decrease in area of the emitter layer to cause degradation in conversion efficiency. Accordingly, for obtaining the excellent conversion efficiency expected in the back contact type solar cell of the present invention, the high resistive layer may be designed so as to have a width of not smaller than 1 μm and not larger than 100 μm.

The invention claimed is:

1. A high photovoltaic-conversion efficiency solar cell comprising on a back surface, as a non-light receiving surface, of a first conductive type semiconductor substrate:

a first conductive type diffusion layer comprising first conductive type impurities diffused in the first conductive type semiconductor substrate;

a second conductive type diffusion layer comprising second conductive type impurities diffused in the first conductive type semiconductor substrate;

a first electrode in contact with the first conductive type diffusion layer;

a second electrode in contact with the second conductive type diffusion layer; and a high resistive layer formed between the first conductive type diffusion layer and the second conductive type diffusion layer, wherein the first conductive type semiconductor substrate is made of single-crystalline silicon or multi-crystalline silicon, a level difference is provided on the back surface, when the back surface is viewed from above, any one of the first conductive type diffusion layer and the second conductive type diffusion layer is provided on an upper level and the other is provided on a lower level, the high resistive layer is provided on the upper level and does not overlap with any of the first conductive type diffusion layer and the second conductive type diffusion layer, in the high resistive layer, a concentration of the first conductive type impurities decreases from a side of the first conductive type diffusion layer toward a side of the second conductive type diffusion layer, and a concentration of the second conductive type impurities decreases from the side of the second conductive type diffusion layer toward the side of the first conductive type diffusion layer, the first conductive type diffusion layer and the second conductive type diffusion layer are on different levels along a thickness direction of the first conductive type semiconductor substrate, the thickness direction perpendicular to the back surface, and the first electrode is also in direct contact with the high resistive layer.

2. The high photovoltaic-conversion efficiency solar cell according to claim 1, wherein, when the back surface is viewed from above, the high resistive layer is formed having a width to make a gap of not smaller than 1 μm and not larger than 100 μm between the first conductive type diffusion layer and the second conductive type diffusion layer.

3. The high photovoltaic-conversion efficiency solar cell according to claim 1, wherein the high resistive layer comprises both the first conductive type impurities and the second conductive type impurities diffused in the first conductive type semiconductor substrate.

4. A method for manufacturing the high photovoltaic-conversion efficiency solar cell according to claim 1, in which the second conductive type diffusion layer, where the second conductive type impurities are diffused, is formed in a first region of the back surface, as the non-light receiving surface, of the first conductive type semiconductor substrate provided with the first region, a second region, and a third region, the first conductive type diffusion layer, where the first conductive type impurities are diffused, is formed in the second region, and the high resistive layer, where the first conductive type impurities and the second conductive type impurities are diffused, is formed in the third region between the first region and the second region, the method comprising:

a second impurity diffusing step of diffusing the second conductive type impurities on an entirety of the back surface of the first conductive type semiconductor substrate to form the second conductive type diffusion layer;

a protective layer forming step of forming a protective layer on the second conductive type diffusion layer;

a first protective layer removing step of removing a portion of the protective layer which covers the second region while tapering a thickness of a portion of the protective layer which covers the third region from an original thickness of the protective layer to almost 0, from a boundary with a portion covering the first region to a boundary with the portion covering the second region;

a second conductive type diffusion layer removing step of removing the second conductive type diffusion layer that is exposed after removal of the protective layer, to expose the second region;

a first impurity diffusing step of diffusing the first conductive type impurities in the second region and the third region via the portion where the protective layer tapers, to respectively form the first conductive type diffusion layer and the high resistive layer; and a second protective layer removing step of removing the remaining protective layer.

5. A method for manufacturing the high photovoltaic-conversion efficiency solar cell according to claim 1, in which the second conductive type diffusion layer, where the second conductive type impurities are diffused, is formed in a first region of the back surface, as the non-light receiving surface, of the first conductive type semiconductor substrate provided with the first region, a second region, and a third region, the first conductive type diffusion layer, where the first conductive type impurities are diffused, is formed in the second region, and the high resistive layer, where the first conductive type impurities and the second conductive type impurities are diffused, is formed in the third region between the first region and the second region, the method comprising:

a first impurity diffusing step of diffusing the first conductive type impurities on an entirety of the back surface of the first conductive type semiconductor substrate to form the first conductive type diffusion layer;

a protective layer forming step of forming a protective layer on the first conductive type diffusion layer;

a first protective layer removing step of removing a portion of the protective layer which covers the second region while tapering a thickness of a portion of the protective layer which covers the third region from an original thickness of the protective layer to almost 0, from a boundary with a portion covering the first region to a boundary with the portion covering the second region;

a first conductive type diffusion layer removing step of removing the first conductive type diffusion layer that is exposed after removal of the protective layer, to expose the second region;

a second impurity diffusing step of diffusing the second conductive type impurities in the second region and the third region via the portion where the protective layer tapers, to respectively form the second conductive type diffusion layer and the high resistive layer; and a second protective layer removing step of removing the remaining protective layer.

6. The method for manufacturing the high photovoltaic-conversion efficiency solar cell according to claim 4, wherein the protective layer is removed and made thinner in the first protective layer removing step by applying etching paste to the portion of the protective layer which covers the second region or irradiating the same portion with laser.

7. The method for manufacturing the high photovoltaic-conversion efficiency solar cell according to claim 4, wherein the protective layer is a silicon oxide layer, a silicon nitride layer, an impurity-containing glass layer, or a laminate formed by laminating two or more of the silicon oxide layer, the silicon nitride layer, and the impurity-containing glass layer.

8. A solar cell module comprising a plurality of the high photovoltaic-conversion efficiency solar cell according to claim 1.

9. A photovoltaic power generation system comprising the solar cell module according to claim 8.

10. The method for manufacturing the high photovoltaic-conversion efficiency solar cell according to claim 5, wherein the protective layer is removed and made thinner in the first protective layer removing step by applying etching paste to the portion of the protective layer which covers the second region or irradiating the same portion with laser.

11. The method for manufacturing the high photovoltaic-conversion efficiency solar cell according to claim 5, wherein the protective layer is a silicon oxide layer, a silicon nitride layer, an impurity-containing glass layer, or a laminate formed by laminating two or more of the silicon oxide layer, the silicon nitride layer, and the impurity-containing glass layer.

12. The high photovoltaic-conversion efficiency solar cell according to claim 1, wherein along the thickness direction of the first conductive type semiconductor substrate, an entirety of the first conductive type diffusion layer is above or below an entirety of the second conductive type diffusion layer.

13. A high photovoltaic-conversion efficiency solar cell comprising on a back surface, as a non-light receiving surface, of a first conductive type semiconductor substrate:

a first conductive type diffusion layer comprising first conductive type impurities diffused in the first conductive type semiconductor substrate;

a second conductive type diffusion layer comprising second conductive type impurities diffused in the first conductive type semiconductor substrate;

a first electrode in contact with the first conductive type diffusion layer;

a second electrode in contact with the second conductive type diffusion layer; and a high resistive layer formed between the first conductive type diffusion layer and the second conductive type diffusion layer, wherein the first conductive type semiconductor substrate is made of single-crystalline silicon or multi-crystalline silicon, a level difference is provided on the back surface, when the back surface is viewed from above, any one of the first conductive type diffusion layer and the second conductive type diffusion layer is provided on an upper level and the other is provided on a lower level, the high resistive layer is provided on the upper level and does not overlap with any of the first conductive type diffusion layer and the second conductive type diffusion layer, in the high resistive layer, a concentration of the first conductive type impurities decreases from a side of the first conductive type diffusion layer toward a side of the second conductive type diffusion layer, and a concentration of the second conductive type impurities decreases from the side of the second conductive type diffusion layer toward the side of the first conductive type diffusion layer, the first conductive type diffusion layer and the second conductive type diffusion layer are on different levels along a thickness direction of the first conductive type semiconductor substrate, the thickness direction perpendicular to the back surface, and the second electrode is also in direct contact with the high resistive layer.

* * * * *